(12) United States Patent
Scharrer et al.

(10) Patent No.: US 8,785,783 B2
(45) Date of Patent: Jul. 22, 2014

(54) PROTECTIVE COVER FOR A FLEXIBLE PRINTED CIRCUIT BOARD

(75) Inventors: Klaus Scharrer, Hohenstadt (DE); Tilo Liebl, Hersbruck (DE); Matthias Wieczorek, Neunkirchen am Sand (DE); Alexander Wenk, Burgoberbach (DE); Hans-Juergen Haering, Waltenhofen (DE); Barbara Haering, legal representative, Waltenhofen (DE); Juergen Henniger, Erlangen-Dechsendorf (DE); Karl-Heinz Baumann, Viernheim (DE)

(73) Assignees: Conti Temic microelectronic GmbH, Nuremberg (DE); Carl Freudenberg KG, Weinheim (DE); Swoboda KG, Wiggensbach (DE)

( * ) Notice: Subject to any disclaimer, the term of this patent is extended or adjusted under 35 U.S.C. 154(b) by 582 days.

(21) Appl. No.: 13/124,710

(22) PCT Filed: Oct. 9, 2009

(86) PCT No.: PCT/DE2009/001410
§ 371 (c)(1),
(2), (4) Date: Sep. 22, 2011

(87) PCT Pub. No.: WO2010/043204
PCT Pub. Date: Apr. 22, 2010

(65) Prior Publication Data
US 2012/0067622 A1 Mar. 22, 2012

(30) Foreign Application Priority Data
Oct. 18, 2008 (DE) .......... 10 2008 052 243

(51) Int. Cl.
H05K 1/03 (2006.01)

(52) U.S. Cl.
USPC .......................................... 174/255

(58) Field of Classification Search
USPC ........ 174/255, 250, 254; 361/679.01, 679.02, 361/724–727
See application file for complete search history.

(56) References Cited

U.S. PATENT DOCUMENTS

| 1,288,395 A | 12/1918 | Duncan |
| 4,450,955 A | 5/1984 | Featherston |
| 5,084,124 A | 1/1992 | Taniguchi |
| 5,417,328 A | 5/1995 | Ritter |

(Continued)

FOREIGN PATENT DOCUMENTS

| DE | 93 07 959 | 8/1993 |
| DE | 94 19 187 | 3/1995 |

(Continued)

OTHER PUBLICATIONS

Office Action in Japanese Patent Application No. 2011-535001, mailed Feb. 19, 2013 (4 pages), with English translation (2 pages).

(Continued)

*Primary Examiner* — Tremesha S Willis
(74) *Attorney, Agent, or Firm* — W. F. Fasse

(57) ABSTRACT

A protective cover for mounting a flexible printed circuit board in a protected manner, includes a protective unit for covering a surface of the flexible printed circuit board and a connecting unit for securely connecting a reinforcing plate to the protective cover.

19 Claims, 3 Drawing Sheets

(56) References Cited

U.S. PATENT DOCUMENTS

| | | | |
|---|---|---|---|
| 5,478,244 A * | 12/1995 | Maue et al. | ................ 439/76.2 |
| 5,921,385 A | 7/1999 | Ploetz et al. | |
| 7,142,433 B2 | 11/2006 | Lechner | |
| 7,505,278 B2 | 3/2009 | Choi et al. | |
| 7,722,364 B2 | 5/2010 | Klinger et al. | |
| 2002/0159001 A1 | 10/2002 | Kim | |
| 2003/0089784 A1 | 5/2003 | Kiryu et al. | |
| 2006/0166524 A1 | 7/2006 | Ho et al. | |
| 2011/0232946 A1 | 9/2011 | Voegerl et al. | |

FOREIGN PATENT DOCUMENTS

| | | |
|---|---|---|
| DE | 296 15 553 | 10/1996 |
| DE | 102006005941 | 8/2007 |
| DE | 102007002901 | 3/2008 |
| JP | 61-154094 | 7/1986 |
| JP | 2000-059051 | 2/2000 |
| JP | 2008/021832 | 1/2008 |
| JP | 2008/130617 | 6/2008 |

OTHER PUBLICATIONS

German Search Report for German Application No. 10 2008 052 243.0, dated Oct. 14, 2009, 4 pages, with English translation, 4 pages, Muenchen, Germany.

International Search Report of the International Searching Authority for International Application PCT/DE2009/001410, mailed Feb. 8, 2010, 3 pages, European Patent Office, HV Rijswijk, Netherlands.

English Translation of PCT International Preliminary Report on Patentability of the International Searching Authority for International Application PCT/DE2009/001410, mailed May 19, 2011, 7 pages, International Bureau of WIPO, Geneva, Switzerland.

* cited by examiner

PROTECTIVE COVER FOR A FLEXIBLE PRINTED CIRCUIT BOARD

FIELD OF THE INVENTION

The invention relates to a protective cover for mounting a flexible printed circuit board in a protected manner. The invention further relates to a printed circuit board having such a protective cover.

BACKGROUND INFORMATION

Flexible printed circuit boards comprise a flexible film made of insulating material with adhesive conductive connections and serve the purpose of mechanically fastening and electrically connecting electronic components. Contact surfaces are attached to surfaces of the flexible printed circuit boards, a flawless condition of the contact surfaces being a prerequisite for a subsequent faultless usage of the flexible printed circuit board.

A process chain for manufacturing, further processing and mounting a flexible printed circuit board comprises a plurality of individual process steps which are linked with each other through various handling and/or transport steps. In particular manual and/or machine handling and/or transport steps can cause damage to the contact surfaces due to scratching or contaminating the contact surfaces as a result of hand perspiration, oil or grease and particles present on a support surface. Flexible printed circuit boards damaged or contaminated in this manner are not suitable for further processing.

For protecting contact surfaces from adverse effects due to contamination or damage, protective adhesive stickers are provided which are affixed to the contact surfaces. On removal of the protective stickers, residues of an adhesive layer can remain on the contact surface, resulting in a contamination of the contact surface. Furthermore, separate protective arrangements for use in individual manufacturing plants as well as complex handling steps in the form of manual handling wearing protective gloves or additional, complexly designed gripper systems in the case of machine handling are known. The above-mentioned protective measures involve high expenditure in terms of plants and/or time and are therefore cost-intensive.

Furthermore, there is a risk of damage and/or contamination of the contact surfaces after finishing one process step and during subsequent handling or transport of the flexible printed circuit boards.

SUMMARY OF THE INVENTION

An object of embodiments of this invention is to create a protective cover for mounting a flexible printed circuit board in a protected manner such that a surface of the flexible printed circuit board is cost-effectively and reliably protected against damage and/or contamination along an entire process chain from manufacture up to mounting of the flexible printed circuit board.

This object is achieved according to embodiments of the invention by protective covers as disclosed herein.

It has been found that a comprehensive protection of a surface of a flexible printed circuit board can be achieved by an embodiment of a protective cover, wherein a protective unit of the protective cover covers the surface in a protecting manner and an accommodating unit or receiving unit serves the purpose of securely accommodating or receiving the flexible printed circuit board in the protective cover. A protective cover of this type is cost-effective.

By using an embodiment of a protective unit configured as a frame, the surface to be protected is accessible for a function test which may have to be carried out.

An embodiment of a protective cover wherein the reinforcing plate is detachably connected to the protective cover ensures that the protective cover can be easily removed from a flexible printed circuit board.

An embodiment of a protective cover wherein the accommodation unit sectionally encloses all edges of the reinforcing plate guarantees a secure mounting of a flexible printed circuit board.

An embodiment of a protective cover having latching projections with insertion slopes and removal slopes facilitates the insertion and removal of a flexible printed circuit board into and from the protective cover.

An embodiment of a protective cover having two detachably connected partial covers is marked by a simple and secure accommodation of a flexible printed circuit board.

An embodiment of a protective cover wherein the partial covers sectionally enclose all edges of the reinforcing plate can guarantee a secure mounting of a flexible printed circuit board within the protective cover.

Another embodiment provides a non-detachable positive plug-type connection of a protective cover to a flexible printed circuit board, which can be achieved in a quick and automatable manner.

An embodiment of a protective cover having mounting pins that are fittingly received in holes of the reinforcing plate, can be plugged onto a flexible printed circuit board.

An embodiment of a connection of a protective cover to a flexible printed circuit board using conical mounting pins is secure.

An embodiment of a protective cover having mounting pins with a predetermined breaking point facilitates detaching the protective cover from a flexible printed circuit board.

An embodiment of a protective cover made of plastic material can be manufactured in a cost-effective manner.

An embodiment of a protective cover with a placing surface enables a defined and secure placement of a flexible printed circuit board.

An embodiment of a protective cover manufactured as a single piece is economical and serves the purpose of securely accommodating a flexible printed circuit board.

Another embodiment provides a combination of a flexible printed circuit board with a protective cover.

BRIEF DESCRIPTION OF THE DRAWINGS

Exemplary embodiments of the invention will now be explained with reference to the drawing, in which.

DETAILED DESCRIPTION OF EXAMPLE EMBODIMENTS OF THE INVENTION

Figure 1:
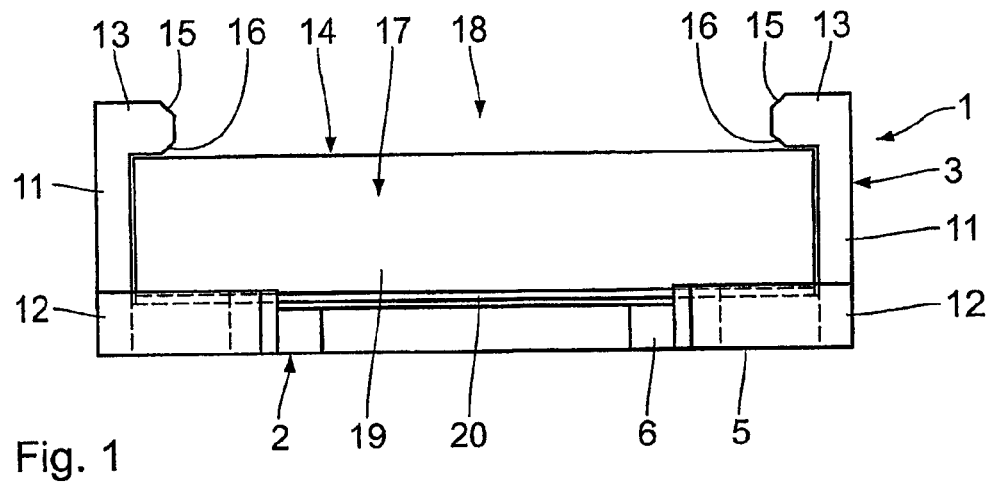
FIG. 1 shows a side view of a first exemplary embodiment of a protective cover with latching projections and a latchingly accommodated flexible printed circuit board.
Figure 2:
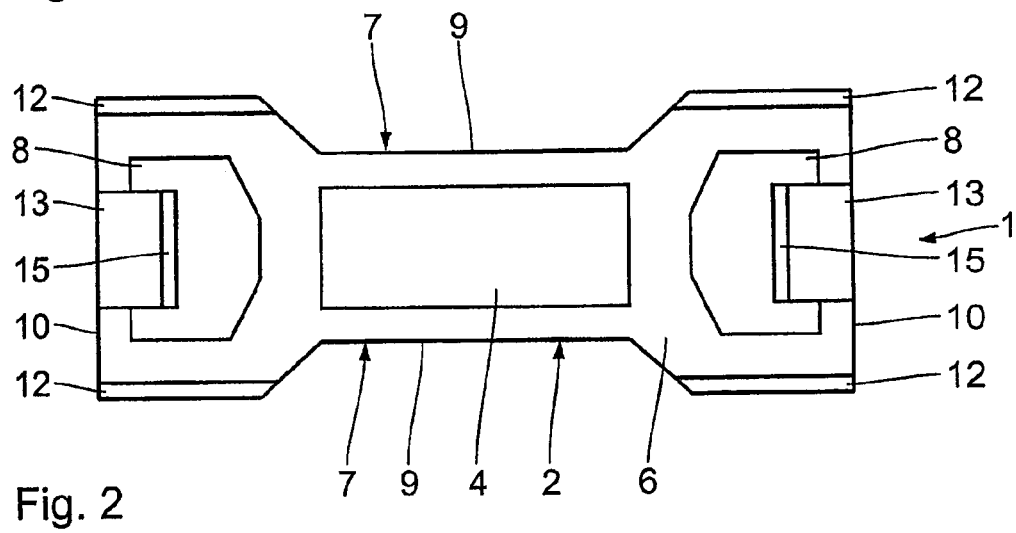
FIG. 2 shows a top view of the protective cover depicted in FIG. 1 without the depiction of the flexible printed circuit board.
Figure 3:
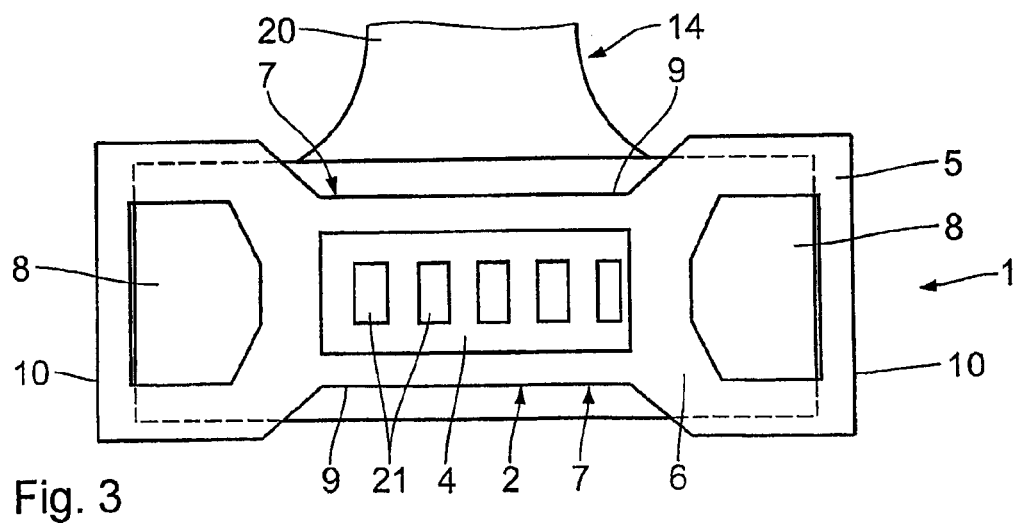
FIG. 3 shows a bottom view of the protective cover depicted in FIG. 1 with the flexible printed circuit board in place.

A first exemplary embodiment of a protective cover 1 depicted in FIGS. 1 to 3 comprises a protective unit 2 and an accommodation unit 3. The protective unit 2 is designed in the form of a frame and has a centrally disposed, rectangular protective opening 4. The protective opening 4 can have also other basic shapes, in particular the protective opening 4 can be circular, elliptical, hexagonal or octagonal. The protective unit 2 is formed integrally with the accommodation unit 3, wherein the protective cover 1 consists of a material which allows forming manufacturing of the protective cover 1, in particular plastic material or metal. Furthermore, the protective cover 1 has a placing surface 5 for securely placing the protective cover 1 on a plane support. The protective unit 2 has a rectangular base plate 6 with two trapezoidal recesses 7 disposed opposite one another and two removal openings 8 disposed opposite one another. The recesses 7 and the removal openings 8 are each disposed on opposite edges 9, 10 of the base plate 6. The accommodation unit 3 has two side walls 11 and four lateral guides 12. The two side walls 11 are disposed on two opposite edges 10 of the base plate 6 such that the side walls 11 project vertically from the base plate 6. At one end of the side wall 11 opposite the end connected to the base surface 6 a latching projection 13 is provided for latchingly accommodating a flexible printed circuit board 14, wherein the latching projection 13 has an insertion slope 15 and a removal slope 16 for inserting and removing the flexible printed circuit board 14. The lateral guides 12 are disposed so as to protrude vertically from the base plate 6, wherein the lateral guides 12 are disposed on the outer edges 9 of the base plate 6 so as to enable a lateral guidance of a flexible printed circuit board 14 which is to be accommodated. By the lateral guides 12, the side walls 11, the base plate 6 and the latching projections 13, an accommodation space 17 is defined, which is provided for accommodating the flexible printed circuit board 14. The two latching projections 13 delimit an insertion opening 18 disposed therebetween. The flexible printed circuit board 14 has a reinforcing plate 19 and a carrier film 20 with a surface 21 to be protected, in particular a contact surface. On latching accommodation of the flexible printed circuit board 14 within the protective cover 1, the surface 21 is disposed at the protective opening 4 in manner such that accessibility of the surface 21 is provided.

The protective cover 1 depicted in FIGS. 1 to 3 serves the purpose of secure accommodation by a latched mounting of the flexible printed circuit board 14. For this purpose, the flexible printed circuit board 14 is inserted into the accommodation space 17 from a side of the protective cover 1 opposite the placing surface 5. With its reinforcing plate 19, the flexible printed circuit board 14 is placed onto the latching projections 13, wherein through a pressure exerted on the reinforcing plate 19 in the direction towards the accommodation space 17 the side walls 11 are pressed laterally outwards, such that the insertion opening 18 becomes larger until the flexible printed circuit board 14 enters the accommodation space 17 through the insertion opening 18 via the insertion slopes 15. During the latching accommodation within the protective cover 1 the flexible printed circuit board 14 is disposed such that the carrier film 20 rests on the base plate 6 and all edges of the reinforcing plate 19 are sectionally enclosed by the accommodation unit 3. The connection of the flexible printed circuit board 14 to the protective cover 1 can be detached. For detaching the flexible printed circuit board 14 from the protective cover 1, the flexible printed circuit board 14 is pressed away from the protective unit 2 upwardly out of the accommodation space 17. For this purpose, pressure is exerted on the carrier film 20 of the flexible printed circuit board 14 such that, analogous to the insertion process, the latching projections 13 are pressed laterally outwards such that the flexible printed circuit board 14 can be removed from the accommodation space 17 through the insertion opening 18 due to the circuit board 14 pressing outwardly on the removal slopes 16. To avoid damaging and/or contaminating the surface 21 of the carrier film 20 during removal, the pressure is exerted on the carrier film 20 through the removal openings 8 or at the recesses 7.

Figure 4:
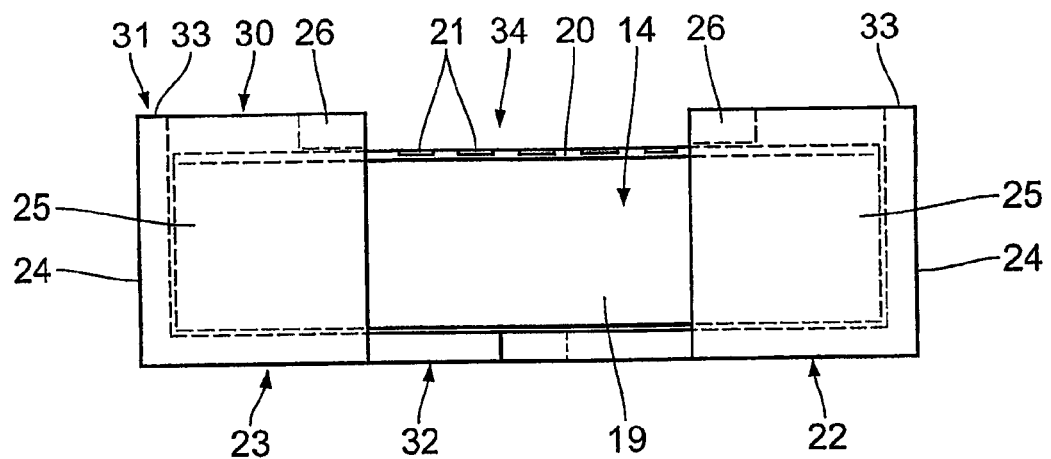
FIG. 4 shows a side view of a second exemplary embodiment of a protective cover, comprising two detachably connected partial covers, and of a flexible printed circuit board accommodated within the protective cover.
Figure 5:
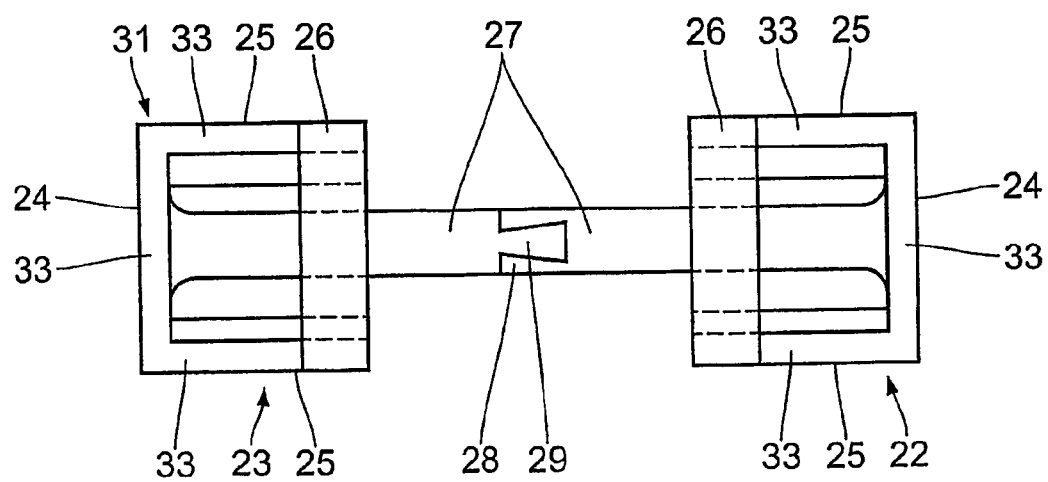
FIG. 5 shows a top view of the second exemplary embodiment of a protective cover depicted in FIG. 2 without the depiction of a flexible printed circuit board.

FIGS. 4 and 5 show a further exemplary embodiment of a protective cover 1. Components which correspond to the ones explained above with reference to FIGS. 1 to 3 are designated by the same reference numerals and are not discussed in detail again.

A protective cover 1 according to FIGS. 4 and 5 has two partial covers 22, 23. Both partial covers 22, 23 each comprise one side wall 24, two lateral guides 25, one securing web 26 and one connecting web 27 with differing connecting elements 28, 29. Through the connecting elements 28, 29 the partial covers 22, 23 can be connected detachably to form the protective cover 1 having a protective unit 30 and an accommodation unit 31. With the exception of the configuration of the connecting elements 28, 29, the partial covers 22, 23 are designed identically. The connecting elements 28, 29 are realized such that a tongue-and-groove connection of the two partial covers 22, 23 is possible. Furthermore, other detachable connection techniques are conceivable using positive connections, in particular snap connections, or using non-positive connections, in particular wedges. The protective unit 30 comprises the two securing webs 26 of the partial covers 22, 23. The exemplary embodiment of the protective cover 1 depicted in FIGS. 4 and 5 has a placing surface 32 which is formed by the securing webs 26 and the cover surfaces 33 of the side walls 24, 25. A flexible printed circuit board 14 is disposed inside the protective cover 1 for secure accommodation such that a reinforcing plate 19 is retained by the connecting webs 27, the securing webs 26, the side walls 24 and the lateral guides 25 and such that the carrier film 20 is disposed at the securing webs 26, wherein a protective opening 34 is formed by the two securing webs 26 for contacting a surface 21.

In the exemplary embodiment according to FIGS. 4 and 5 an accommodation of the flexible printed circuit board 14 within the protective cover 1 is achieved by placing the flexible printed circuit board 14 into a first partial cover 22 and subsequently sliding the second partial cover 23 laterally onto the first partial cover 22 which accommodates the flexible printed circuit board 14. A secure accommodation of the flexible printed circuit board 14 by the protective cover 1 is ensured as soon as the connecting elements 28, 29 engage one another. By accommodation of the flexible printed circuit board 14 in one partial cover 22, 23 all edges but one of the reinforcing plate 19 are sectionally enclosed by the partial covers 22, 23. By the detachable connection of the two partial covers 22, 23 all edges of the reinforcing plate 19 accommodated by the two partial covers 22, 23 are sectionally enclosed, such that any unintentional detachment of the flexible printed circuit board 14 from the protective cover 1 is impossible. For removing the flexible printed circuit board 14 from the protective cover 1 the connection of the two partial covers 22, 23 is detached by pulling the two connecting elements 28, 29 apart, such that the flexible printed circuit board 14 can be pulled out from of the partial covers 22, 23 laterally in the direction towards the connecting element 28, 29.

Figure 6:
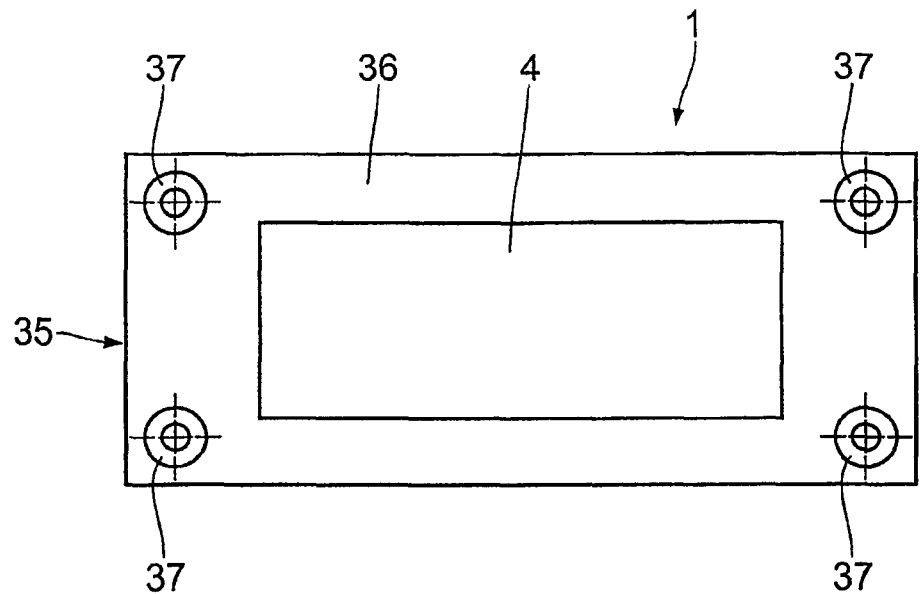
FIG. 6 shows a top view of a third exemplary embodiment of a protective cover with four pins designed in the shape of a truncated cone.
Figure 7:
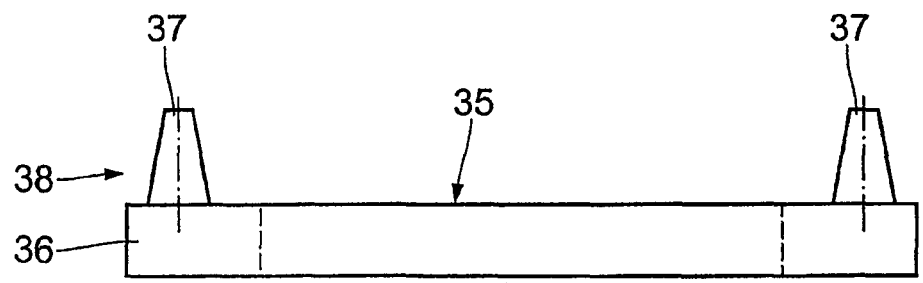
FIG. 7 shows a side view of the third exemplary embodiment of a protective cover depicted in FIG. 6.

FIGS. 6 and 7 show a third exemplary embodiment of a protective cover 1. Components which correspond to the ones explained above with reference to FIGS. 1 to 5 are designated by the same reference numerals and are not discussed in detail again.

A protective unit 35 of the protective cover 1 according to FIGS. 6 and 7 comprises a rectangular base plate 36 having a centrally disposed protective opening 4. The base plate 36 can also be designed circularly, elliptically, hexagonally or octagonally. At each corner of the base plate 36 one connecting pin 37 is disposed such that it projects vertically from the base plate 36. The connecting pin 37 is designed as a truncated cone, wherein the pin 37 can also be realized as a cone. The connecting pins 37 form an accommodation unit 38 for accommodating a flexible printed circuit board 14, not depicted, having a carrier film 20 and a reinforcing plate 19, wherein bores are provided in the reinforcing plate 19 for accommodating the connecting pins 37. The bores have an inner contour which corresponds to the outer contour of the connecting pins 37.

A connection of the flexible printed circuit board 14, not depicted, to the protective cover 1 according to the third exemplary embodiment is achieved by plugging the flexible printed circuit board 14 onto the base plate 36, wherein the connecting pins 37 engage the bores provided for this purpose. Due to the inner contour of the bores, which corresponds to the outer contour of the connecting pins 37, a non-detachable, in particular positive, connection is the result.

Figure 8:
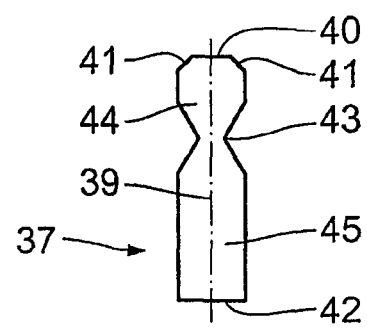
FIG. 8 shows a side view of a further embodiment of a pin.

FIG. 8 shows a further embodiment of a connecting pin 37. The connecting pin 37 has a concentric cross-sectional area which varies in size along a central longitudinal axis 39 of the pin 37. On a head side 40 the pin 37 has an insertion aid 41 for simplified insertion of the pin 37 into a bore of a reinforcement plate 19 of a flexible printed circuit board 14. The basic shape of the cross-sectional area of the pin 37 can be circular, elliptical, triangular, rectangular or hexagonal. Furthermore, the pin 37 has a minimum cross-section, wherein the minimum cross-sectional area is disposed neither at the head side 40 nor at a bottom side 42. Thus, the minimum cross-sectional area constitutes a predetermined breaking point 43 of the pin 37. The predetermined breaking point 43 divides the pin 37 into a head 44 and a body 45, wherein the head 44 is disposed between the predetermined breaking point 43 and the head side 40, and the body 45 is disposed between the predetermined breaking point 43 and the bottom side 42.

Using the connecting pin 37 according to FIG. 8 on the protective cover 1 facilitates a detachment of the flexible printed circuit board 14 from the protective cover 1 once the protective cover 1 has been connected to the flexible printed circuit board 1. For this purpose, the flexible printed circuit board 14 is pulled upwardly away from the protective cover 1 along the central longitudinal axis 39 such that the head 44 is separated from the body 45 at the predetermined breaking point 43 and remains inside the bore of the flexible printed circuit board 14. The body 45 remains connected to a protective unit 35 of the protective cover 1 at the bottom side 42.

A protective cover 1 which can be connected to a flexible printed circuit board 14 in a detachable manner can be detached from the flexible printed circuit board 14 at the end of a process chain and be reused afterwards. In a suitable realization of an accommodation unit 3, 31, 38 and a protective unit 2, 30, 35 a protective cover 1 can be used for accommodating multiple, different flexible printed circuit board 14. Furthermore, it is possible to leave the protective cover 1 connected to the flexible printed circuit board 14 at the end of a process chain and to integrate the protective cover 1 into an electronic assembly during subsequent mounting of the flexible printed circuit board 14, and in particular to use it as part of a housing of the electronic assembly.

The invention claimed is:

1. A protective cover (1) for the protected mounting of a flexible printed circuit board (14) having a flexible carrier film (20) and a reinforcing plate (19) that reinforces at least a portion of the flexible carrier film, said protective cover comprising a protective unit (2; 30; 35) adapted to cover a selected surface (21) of the flexible printed circuit board (14), and an accommodation unit (3; 31; 38) adapted to securely accommodate the reinforcing plate (19) of the flexible printed circuit board (14) and connect the reinforcing plate with the protective cover (1), wherein the protective unit (2; 30; 35) is configured as a frame such that the selected surface (21) of the flexible printed circuit board (14) is accessible through an opening of the frame, wherein the protective cover (1) is connected to the reinforcing plate by the accommodation unit in a detachable manner, wherein the accommodation unit (3; 31; 38) sectionally encloses all edges of the reinforcing plate (19), and wherein the accommodation unit (3) comprises multiple side walls having latching projections (13) for latching onto a back surface of the reinforcing plate (19) opposite the flexible carrier film, wherein the latching projections (13) each have inclined portions on opposite edges thereof forming insertion slopes (15) and removal slopes (16) along which the flexible printed circuit board slides to deflect the side walls outwardly during insertion of the flexible printed circuit board into and removal of the flexible printed circuit board from an accommodation space of the protective cover.

2. The protective cover (1) according to claim 1, wherein the protective cover (1) consists of plastic material.

3. The protective cover (1) according to claim 1, wherein the protective cover (1) has a placing surface (5; 32) for secure placement on a plane surface.

4. The protective cover (1) according to claim 1, wherein the protective cover (1) is manufactured as a single piece.

5. A combination comprising the protective cover according to claim 1 and the flexible printed circuit board, wherein the flexible printed circuit board (14) is accommodated by the protective cover (1).

6. A protective arrangement for protecting and supporting a flexible printed circuit board during manufacturing or processing thereof, wherein the flexible printed circuit board includes flexible circuit conductors on a flexible carrier film, and has a selected surface that includes a contact surface area which is to be subjected to further processing, and wherein said protective arrangement comprises: a support plate configured and adapted to support at least a portion of the flexible carrier film on a planar support surface of said support plate such that the selected surface of the flexible printed circuit board faces away from said planar support surface; and a protective cover configured to be removably engaged onto a combination including the flexible printed circuit board supported on said support plate, and to protect the selected surface while leaving the contact surface area of the flexible printed circuit board accessible for the further processing; wherein said protective cover comprises: a planar base plate configured to extend along and cover portions of the selected surface of the flexible printed circuit board, with at least a portion of the flexible carrier film received between said base plate and said support plate, and wherein said base plate has a protective opening located and configured to expose and leave accessible the contact surface area of the flexible printed circuit board for the further processing, two oppositely located latching side walls that project from said planar base plate away from a plane of said planar base plate, and that respectively extend along two opposite sides of said support plate, with said support plate and at least the portion of the flexible carrier film received between said latching side walls, two latching projections that respectively extend toward each other from respective free ends of said latching side walls, and that engage over a back surface of said support plate opposite said planar support surface, wherein said latching side walls are flexibly deflectable to allow said latching side walls and therewith said latching projections to be flexibly deflected away from and out of engagement with said support plate, and two oppositely located lateral guide walls that project from said planar base plate away from said plane of said planar base plate, and that respectively extend along two opposite lateral edges of the flexible carrier film, with the flexible carrier film received between said lateral guide walls.

7. The protective arrangement according to claim 6, wherein said latching projections have first tapering slopes on edges thereof facing outwardly away from said base plate and second tapering slopes on edges thereof facing inwardly toward said base plate, and wherein said tapering slopes allow said support plate to slide along said tapering slopes thereby causing said latching side walls to deflect laterally away from said support plate when engaging said protective cover onto or removing said protective cover from said combination including the flexible printed circuit board supported on said support plate.

8. The protective arrangement according to claim 6, wherein said protective cover is a one-piece integral component including said base plate, said side walls, said latching projections and said lateral guide walls.

9. The protective arrangement according to claim 6, wherein said two side walls are spaced apart and parallel to one another, said two lateral guides are spaced apart and parallel to one another, and said lateral guides extend perpendicularly to said side walls.

10. The protective arrangement according to claim 6, wherein said base plate and said support plate cover and support only a first portion of the flexible carrier film therebetween, and a second portion of the flexible carrier film protrudes out of said protective cover.

11. The protective arrangement according to claim 6, wherein said support plate is and remains connected to the portion of the flexible carrier film.

12. The protective arrangement according to claim 6, wherein the flexible printed circuit board is assembled into an electronic assembly after the further processing, and said protective cover remains connected to the flexible printed circuit board and serves as a housing of the electronic assembly.

13. The protective arrangement according to claim 6, wherein said protective cover is to be detached and separated from the flexible printed circuit board after the further processing.

14. A protective arrangement for protecting and supporting a flexible printed circuit board during manufacturing or processing thereof, wherein the flexible printed circuit board includes flexible circuit conductors on a flexible carrier film, and has a selected surface that includes a contact surface area which is to be subjected to further processing, and wherein said protective arrangement comprises: a support plate configured and adapted to support at least a portion of the flexible carrier film on a planar support surface of said support plate such that the selected surface of the flexible printed circuit board faces away from said planar support surface; and a protective cover configured to be removably engaged onto a combination including the flexible printed circuit board supported on said support plate, and to protect the selected surface while leaving the contact surface area of the flexible printed circuit board accessible for the further processing; wherein said protective cover comprises: a first partial cover comprising a first end wall, two mutually parallel first side walls, and a first connecting web that extends parallel to and beyond said first side walls and that has a first connecting element thereon, and a second partial cover comprising a second end wall, two mutually parallel second side walls, and a second connecting web that extends parallel to and beyond said second side walls and that has a second connecting element thereon; and wherein: said first and second connecting webs extend toward one another, said first and second connecting elements are releasably coupled with one another, said support plate and at least the portion of the flexible carrier film on said support plate are received between said first and second end walls, between said first side walls, and between said second side walls, the selected surface of the flexible printed circuit board faces opposite away from said first and second connecting elements, the contact surface area of the flexible printed circuit board is exposed and accessible, and said side walls and said end walls protrude higher than the selected surface of the flexible printed circuit board so as to protect the selected surface while leaving the contact surface area exposed.

15. The protective arrangement according to claim 14, wherein:
said first partial cover further comprises a first securing web that extends between and interconnects said first side walls,
said second partial cover further comprises a second securing web that extends between and interconnects said second side walls,
said first and second securing webs are positioned on the selected surface of the flexible printed circuit board so that said support plate and at least the portion of the flexible carrier film on said support plate are received between said securing webs on one side and said connecting webs on an opposite side, and
the contact surface area of the flexible printed circuit board is exposed and accessible between said first and second securing webs.

16. The protective arrangement according to claim 14, wherein each one of said partial covers is respectively a one-piece integral component.

17. The protective arrangement according to claim 14, wherein said support plate is connected to the flexible carrier film and remains connected to the flexible carrier film after the further processing.

18. The protective arrangement according to claim 14, wherein the flexible printed circuit board is assembled into an electronic assembly after the further processing, and said protective cover remains connected to the flexible printed circuit board and serves as a housing of the electronic assembly.

19. The protective arrangement according to claim 14, wherein said protective cover is to be detached and separated from the flexible printed circuit board after the further processing.

\* \* \* \* \*